(12) United States Patent
Yen et al.

(10) Patent No.: US 11,387,034 B2
(45) Date of Patent: Jul. 12, 2022

(54) ASYMMETRIC SPIRAL INDUCTOR

(71) Applicant: REALTEK SEMICONDUCTOR CORPORATION, Hsinchu (TW)

(72) Inventors: Hsiao-Tsung Yen, Hsinchu (TW); Yuh-Sheng Jean, Hsinchu County (TW); Ta-Hsun Yeh, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 413 days.

(21) Appl. No.: 15/972,645

(22) Filed: May 7, 2018

(65) Prior Publication Data
US 2018/0366254 A1 Dec. 20, 2018

(30) Foreign Application Priority Data

Jun. 19, 2017 (TW) ................................ 106120290

(51) Int. Cl.
*H01F 27/28* (2006.01)
*H01F 27/29* (2006.01)
(Continued)

(52) U.S. Cl.
CPC ..... *H01F 27/2804* (2013.01); *H01F 17/0006* (2013.01); *H01F 27/29* (2013.01);
(Continued)

(58) Field of Classification Search
CPC ......... H01F 2027/2809; H01F 17/0013; H01F 27/2804; H01F 27/29
(Continued)

(56) References Cited

U.S. PATENT DOCUMENTS 4,613,843 A * 9/1986 Esper .................... F02P 7/0675
324/207.15
5,477,204 A * 12/1995 Li ....................... H01F 17/0006
336/200
(Continued)

FOREIGN PATENT DOCUMENTS

CN 101145435 A 3/2008
CN 101331586 A 12/2008
(Continued)

OTHER PUBLICATIONS

OA letter of the counterpart CN application (appl. No. 201710493729.0) mailed on Aug. 23, 2019. Summary of the OA letter: 1. Claims 1 and 10 are anticipated by reference 1(CN101331586A). 2. Reference 1(CN101331586A) renders claims 8-9 obvious.
(Continued)

*Primary Examiner* — Elvin G Enad
*Assistant Examiner* — Joselito S. Baisa
(74) *Attorney, Agent, or Firm* — WPAT, PC

(57) ABSTRACT

An asymmetric spiral inductor fabricated in a semiconductor structure includes a spiral coil, a metal segment, and a connection structure. The spiral coil is substantially disposed in a first metal layer and includes a first terminal and a second terminal. The first terminal is disposed at an outermost turn of the spiral coil, and the second terminal is disposed at an innermost turn of the spiral coil. The metal segment is disposed in a second metal layer different from the first metal layer and has a third terminal and a fourth terminal. The connection structure connects the second terminal and the third terminal. The first terminal and the fourth terminal form the two terminals of the asymmetric spiral inductor. The spiral coil is a polygon with N sides (N>4). A portion of the metal segment has a shape substantially identical to a portion of the contour of the polygon.

5 Claims, 15 Drawing Sheets

(51) Int. Cl.
  *H01L 23/522*   (2006.01)
  *H01L 49/02*    (2006.01)
  *H01F 17/00*    (2006.01)
(52) U.S. Cl.
  CPC .......... *H01L 23/5227* (2013.01); *H01L 28/10* (2013.01); *H01F 2017/0046* (2013.01); *H01F 2017/0073* (2013.01); *H01F 2017/0086* (2013.01); *H01F 2027/2809* (2013.01)
(58) Field of Classification Search
  USPC ........................................ 336/190
  See application file for complete search history.

(56) References Cited

U.S. PATENT DOCUMENTS

| | | | |
|---|---|---|---|
| 5,656,849 A | 8/1997 | Burghartz et al. | |
| 5,970,604 A * | 10/1999 | Person | H01F 17/0013 29/602.1 |
| 6,429,504 B1 * | 8/2002 | Beaussart | H01L 23/5227 257/516 |
| 6,653,910 B2 * | 11/2003 | Escalera | H01P 5/10 333/25 |
| 6,911,887 B1 * | 6/2005 | Uriu | H01F 17/0013 336/200 |
| 7,199,682 B2 * | 4/2007 | Ezzeddine | H01F 5/003 333/177 |
| 7,312,684 B2 | 12/2007 | Aoki | |
| 7,327,207 B2 * | 2/2008 | Asakawa | H01F 17/0013 333/175 |
| 7,626,480 B2 * | 12/2009 | Lee | H01F 17/0013 336/200 |
| 7,675,464 B2 * | 3/2010 | Cleeves | H01Q 7/00 343/700 MS |
| 8,049,589 B2 * | 11/2011 | Chen | H03H 7/422 336/200 |
| 8,054,155 B2 * | 11/2011 | Raczkowski | H01L 23/645 336/200 |
| 8,198,970 B2 * | 6/2012 | Choi | H03H 7/42 336/200 |
| 8,427,388 B2 * | 4/2013 | Fahs | H01P 5/10 343/859 |
| 8,552,812 B2 * | 10/2013 | Yen | H01L 23/5223 336/200 |
| 9,142,342 B2 * | 9/2015 | Haner | H03H 7/0115 |
| 9,251,942 B2 * | 2/2016 | Hashimoto | H01Q 21/28 |
| 9,773,606 B2 * | 9/2017 | Yen | H01F 5/00 |
| 10,283,257 B2 * | 5/2019 | Kim | H01F 41/041 |
| 10,374,511 B2 * | 8/2019 | Salem | H02M 3/07 |
| 2002/0101322 A1 | 8/2002 | Liu et al. | |
| 2005/0099241 A1 * | 5/2005 | Ezzeddine | H01F 5/003 333/25 |
| 2006/0022770 A1 * | 2/2006 | Asakawa | H03H 7/1766 333/175 |
| 2007/0247269 A1 * | 10/2007 | Papananos | H01L 23/5227 336/200 |
| 2009/0284339 A1 | 11/2009 | Choi et al. | |
| 2009/0289727 A1 | 11/2009 | El Rai | |
| 2010/0117737 A1 | 5/2010 | Kondo et al. | |
| 2010/0120244 A1 * | 5/2010 | Lim | H01L 23/5225 438/657 |
| 2011/0018672 A1 * | 1/2011 | Papananos | H03H 7/42 336/200 |
| 2012/0146741 A1 * | 6/2012 | Yen | H01L 23/5223 333/25 |
| 2013/0200977 A1 * | 8/2013 | Miyazaki | H01F 17/0013 336/192 |
| 2014/0070913 A1 | 3/2014 | Beer et al. | |
| 2014/0198418 A1 * | 7/2014 | Wang | H01L 23/5227 361/56 |
| 2014/0225698 A1 * | 8/2014 | Swirhun | H01F 21/12 29/602.1 |
| 2015/0091687 A1 | 4/2015 | Valentin | |
| 2015/0130579 A1 * | 5/2015 | Kim | H01F 27/2804 336/200 |
| 2015/0310980 A1 | 10/2015 | Yen et al. | |
| 2016/0028146 A1 * | 1/2016 | Zhang | H01P 5/184 333/112 |
| 2017/0117079 A1 | 4/2017 | Yen et al. | |
| 2017/0162318 A1 * | 6/2017 | Yen | H01L 23/5227 |
| 2018/0151287 A1 | 5/2018 | Yosui et al. | |

FOREIGN PATENT DOCUMENTS

| | | |
|---|---|---|
| CN | 105023739 A | 11/2015 |
| CN | 109860146 A | 6/2019 |
| JP | 2001060515 | 3/2001 |
| TW | 201335957 | 9/2013 |

OTHER PUBLICATIONS

OA letter of the US application (U.S. Appl. No. 15/291,748), filed Jun. 27, 2019.
OA letter of the US application (U.S. Appl. No. 15/293,101), filed Jun. 12, 2019.
OA letter of US application (U.S. Appl. No. 15/291,748), filed Mar. 4, 2020.
Taiwan Patent Office "Office Action" dated Jul. 31, 2018, Taiwan. Summary of the OA letter: Reference 1(TW 201335957) renders claims 1 and 4 of a divisional application of TW counterpart application obvious.
OA letter of US application (U.S. Appl. No. 15/291,748), filed Nov. 27, 2019.
China Patent Office "Office Action" dated Aug. 15, 2018, China. OA letter of counterpart CN application of US application (U.S. Appl. No. 15/239,101) Summary of the OA letter: The cited reference 1 anticipates claims 1-2 and 8-9 and renders claims 3-4 obvious.
Taiwan Intellectual Property Office (TIPO), OA letter of the counterpart TW application (appl. No. 106120290) mailed on Nov. 20, 2017. Summary of the OA letter: US 2015/0130579 renders claim 10 obvious, and US 2015/0130579 and JP 2001-60515A render claims 1-6 obvious.
Taiwan Intellectual Property Office (TIPO), OA letter of the counterpart TW application (appl. No. 106120290) mailed on Mar. 8, 2018. Summary of the OA letter: US 2015/0130579 renders claim 10 obvious, and US 2015/0130579 and JP 2001-60515A render claim 5 obvious.
OA letter of the CN application (appl. No. 201911294586.6) mailed on Nov. 1, 2021. Summary of the OA letter: Claims 1~10 are rejected under Chinese Patent Act §22-3 as being obvious by D1(CN109860146A).
OA letter of the counterpart CN application (appl. No. 201911294586.6) dated May 18, 2022. Summary of the OA letter: Claims 1-9 are rejected under Chinese Patent Act §22-3 as being obvious by D2(CN101145435A).

* cited by examiner

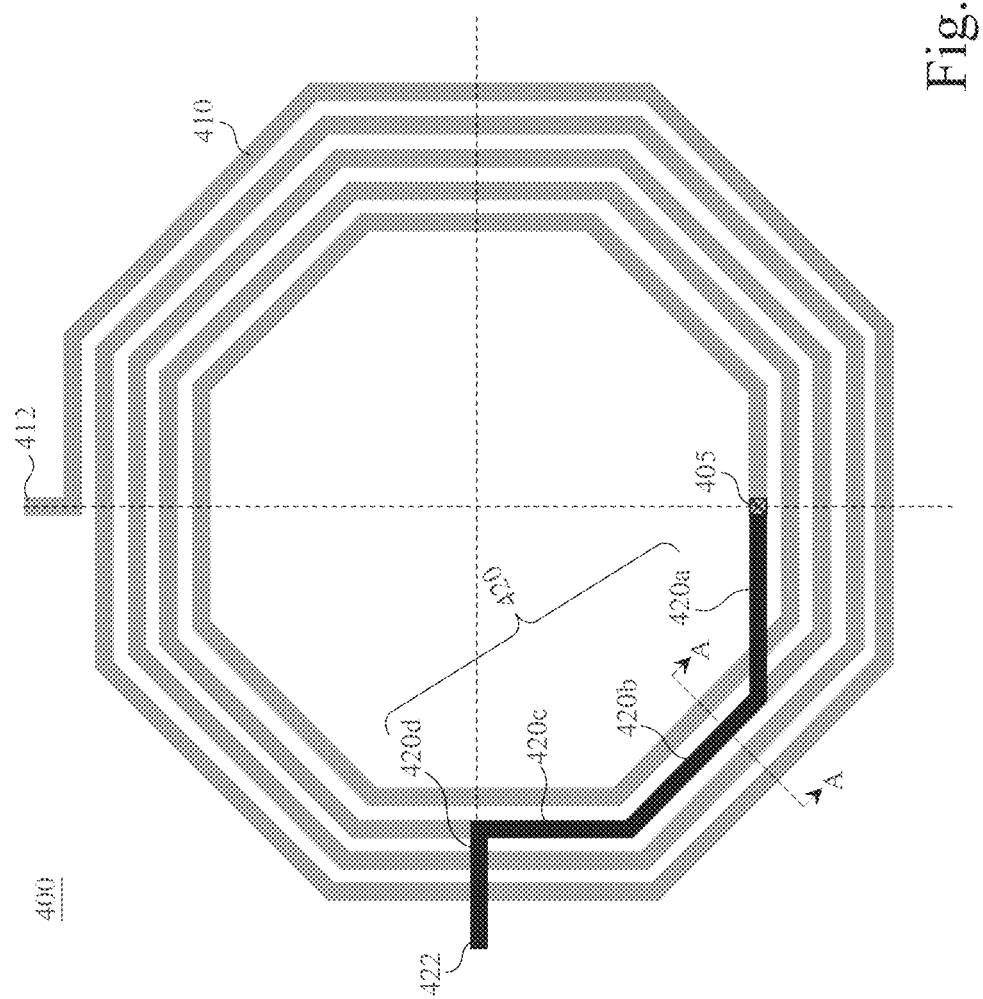

ASYMMETRIC SPIRAL INDUCTOR

BACKGROUND OF THE INVENTION

1. Field of the Invention

The present invention generally relates to integrated inductors, and, more particularly, to asymmetric spiral integrated inductors.

2. Description of Related Art

FIG. 1 and FIG. 2 respectively show an asymmetric spiral inductor and a symmetric spiral inductor of conventional types. The asymmetric spiral inductor 100 and the symmetric spiral inductor 200 are planar structures and are mainly made up of metal segments in two metal layers, which are respectively represented in gray and black. The metal segments in different metal layers are connected by through structures 105, such as a via structure or a via array in a semiconductor process. In general, the symmetric spiral inductor 200 is suitable for differential signals because it is symmetric in structure, while the asymmetric spiral inductor 100 is suitable for single-ended signals.

One of the approaches to increase the inductance of the asymmetric spiral inductor 100 and the symmetric spiral inductor 200 is to increase their numbers of turns. In addition to an increase in the area of the asymmetric spiral inductor 100 and the symmetric spiral inductor 200, the increase in the numbers of turns results in increases in parasitic series resistance and parasitic capacitance as well. High parasitic series resistance and parasitic capacitance cause the self-resonant frequency and the quality factor Q of the asymmetric spiral inductor 100 and the symmetric spiral inductor 200 to decrease. In addition, metal loss and substrate loss are also key factors that affect the quality factor Q. Metal loss is due to the resistance of the metal itself. There are two reasons for substrate loss. The first reason is that when the inductor is in operation, a time-varying electric displacement between the metal coil of the inductor and the substrate is generated; this electric displacement results in a displacement current between the metal coil and the substrate, and this displacement current penetrates into the substrate of low impedance, thereby causing energy loss. The displacement current is associated with the coil area of the inductor. The larger the area, the larger the displacement current. The second reason is that the time-varying electromagnetic field of the inductor penetrates through the dielectric and generates a magnetically induced eddy current on the substrate. The magnetically induced eddy current and the inductor current are opposite in directions, resulting in energy loss.

When the inductor is operated at low frequencies, the current in the metal coil is evenly distributed. In this case, the metal loss at low frequencies is due to the series resistance of the metal coil. When the inductor is operated at high frequencies, the metal coil closer to the inner turns generates stronger magnetic field; a strong magnetic field induces eddy currents in the inner turns of the metal coil. The eddy currents cause uneven distribution of currents—most of the currents are pushed to the surface of the metal coil; this phenomenon is known as the skin effect. Because the currents pass through a smaller metal cross section in the skin effect, the currents encounter a greater resistance, thereby resulting in decrease in the quality factor Q.

Therefore, it is important in the art to improve the quality factor Q and the inductance of the inductor without increasing the inductor area.

SUMMARY OF THE INVENTION

In view of the issues of the prior art, an object of the present invention is to provide an asymmetric spiral inductor, so as to make an improvement to the prior art.

An asymmetric spiral inductor fabricated in a semiconductor structure is provided. The asymmetric spiral inductor includes a first metal segment, a second metal segment, and a connection structure. The first metal segment is in a first metal layer, substantially forms a spiral coil, and has a first terminal and a second terminal. The second metal segment is in a second metal layer different from the first metal layer and has a third terminal and a fourth terminal. The connection structure connects the second terminal and the third terminal. The first terminal and the fourth terminal form two terminals of the asymmetric spiral inductor. The spiral coil is a polygon with N sides (N>4). A portion of the second metal segment extends along a portion of the edge of the polygon, and the length of the second metal segment is not greater than one turn of the spiral coil.

Another asymmetric spiral inductor fabricated in a semiconductor structure is also provided. The asymmetric spiral inductor includes a spiral coil, a metal segment, and a connection structure. The spiral coil is substantially disposed in a first metal layer and has a first terminal and a second terminal. The first terminal is disposed at an outermost turn of the spiral coil, and the second terminal is disposed at an innermost turn of the spiral coil. The metal segment is disposed in a second metal layer different from the first metal layer and has a third terminal and a fourth terminal. The connection structure connects the second terminal and the third terminal. The first terminal and the fourth terminal form two terminals of the asymmetric spiral inductor. The spiral coil is a polygon with N sides (N>4). A portion of the metal segment has a shape substantially the same as a portion of the contour of the polygon.

Compared with the prior art, the asymmetric spiral inductor of the present invention can improve the inductance and the quality factor Q without increasing the overall area. In addition, the asymmetric spiral inductor of the present invention has asymmetric quality factors, which is beneficial to suppressing the interference of reflected signals.

These and other objectives of the present invention no doubt become obvious to those of ordinary skill in the art after reading the following detailed description of the preferred embodiments with reference to the various figures and drawings.

BRIEF DESCRIPTION OF THE DRAWINGS

FIG. 4A illustrates a structure of the asymmetric spiral inductor according to another embodiment of the present invention.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes asymmetric spiral inductors. On account of that some or all elements of the asymmetric spiral inductors could be known, the detail of such elements is omitted provided that such detail has little to do with the features of this disclosure and this omission nowhere dissatisfies the specification and enablement requirements. A person having ordinary skill in the art can choose components equivalent to those described in this specification to carry out the present invention, which means that the scope of this invention is not limited to the embodiments in the specification.

Figure 1:
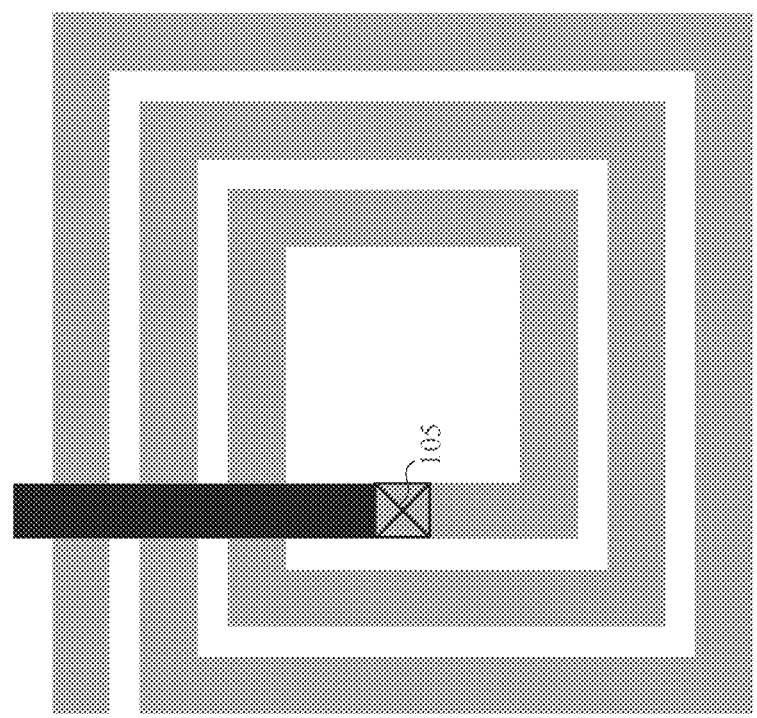
FIG. 1 illustrates an asymmetric spiral inductor.
Figure 2:
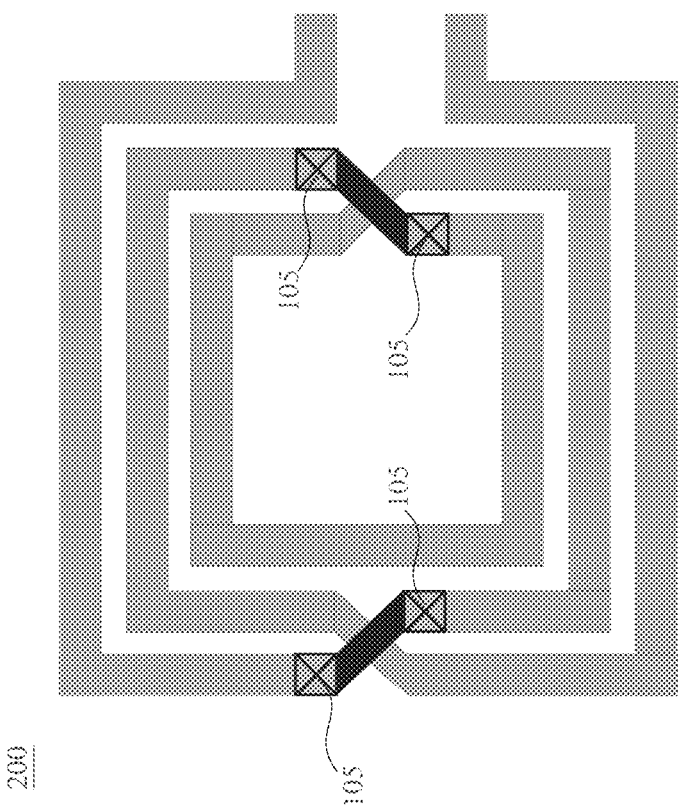
FIG. 2 illustrates a symmetric spiral inductor.
Figure 3A:
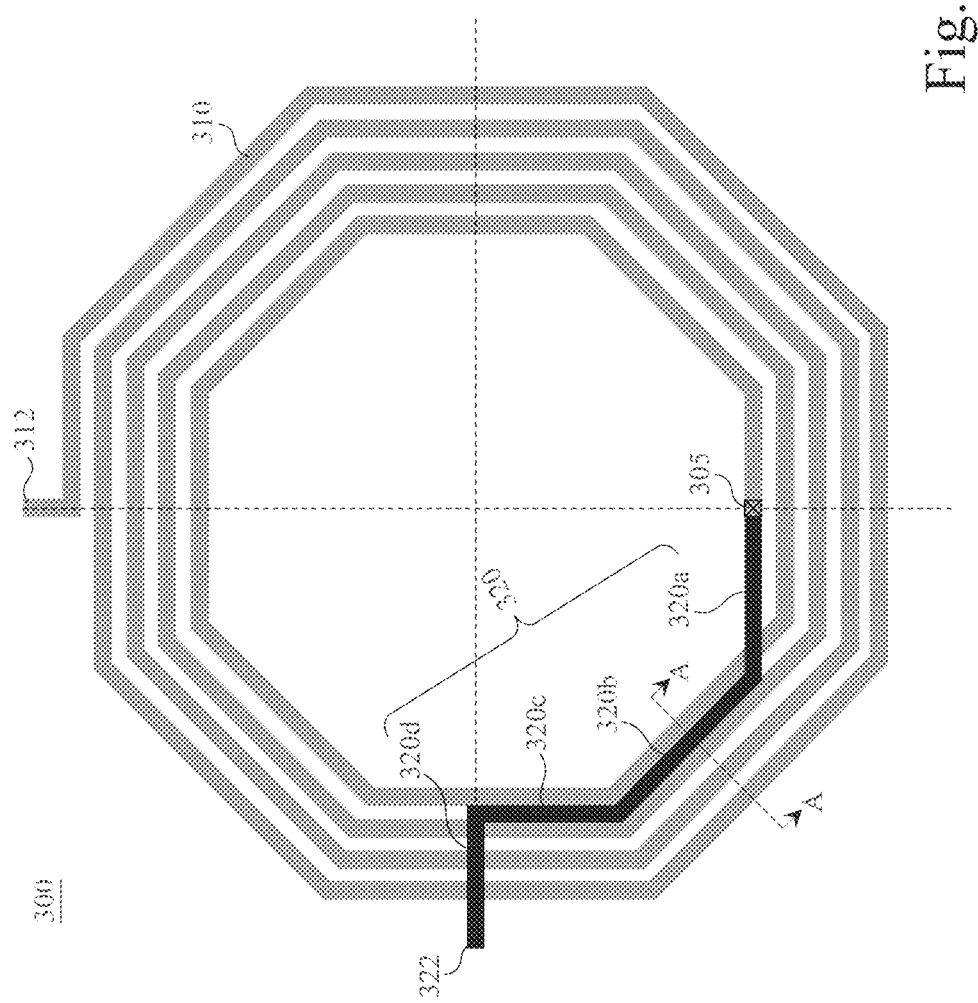
FIG. 3A illustrates the structure of an asymmetric spiral inductor according to an embodiment of the present invention.

FIG. 3A shows the structure of an asymmetric spiral inductor according to an embodiment of the present invention. The asymmetric spiral inductor 300 is fabricated in a semiconductor structure and mainly includes a metal segment 310 and a metal segment 320. In this embodiment, the metal segment 310 is fabricated in the lower metal layer (represented in gray), and the metal segment 320 is fabricated in the upper metal layer (represented in black). For example, the lower metal layer can be an ultra-thick metal (UTM) layer in a semiconductor structure, and the upper metal layer can be a re-distribution layer (RDL) in the semiconductor structure. The metal segment 310 and the metal segment 320 are connected by a connection structure 305 such as a via structure or a via array in a semiconductor process. The metal segment 310 has two terminals, one of which is the terminal 312, and the other of which is connected to the metal segment 320 through the connection structure 305. Similarly, the metal segment 320 has two terminals, one of which is the terminal 322, and the other of which is connected to the metal segment 310 through the connection structure 305. Being connected, the metal segment 310 and the metal segment 320 together form the asymmetric spiral inductor 300. The two terminals of the asymmetric spiral inductor 300 are the terminal 312 and the terminal 322.

The metal segment 310 itself forms a spiral coil, which is substantially disposed in the same metal layer. In a preferred embodiment, the number of turns of the metal segment 310 is greater than or equal to one. The terminal 312 is disposed at the outermost turn of the spiral coil, while the other terminal of the metal segment 310 (the terminal directly connected to the connection structure 305) is disposed at the innermost turn of the spiral coil. The metal segment 320 may be regarded as including multiple metal sub-segments 320a to 320d when it is broken down into fragments by the turning points. The metal sub-segment 320a extends from the innermost turn of the spiral coil (i.e., starting from the connection structure 305) to a place between the innermost turn of the spiral coil and the outermost turn of the spiral coil. More specifically, the metal sub-segment 320a crosses at least one turn of the spiral coil (one turn for this embodiment); that is, the metal sub-segment 320a partially overlaps with the metal segment 310. Starting from one terminal of the metal sub-segment 320a and substantially disposed between the innermost turn of the spiral coil and the outermost turn of the spiral coil, the metal sub-segment 320b extends along the contour of the spiral coil. More specifically, the spiral coil is a polygon with N sides (N>4), and the metal sub-segment 320b extends along one of the sides of the polygon and is substantially parallel to that side. In other words, the metal sub-segment 320b corresponds to a part of the metal sub-segments of the metal segment 310, with the part of the metal sub-segments being adjacent to the projection of the metal sub-segment 320b on the lower metal layer and substantially parallel to the metal sub-segment 320b. Similarly, starting from one terminal of the metal sub-segment 320b and substantially disposed between the innermost turn of the spiral coil and the outermost turn of the spiral coil, the metal sub-segment 320c extends along the contour of the spiral coil. More specifically, the metal sub-segment 320c extends along one of the sides of the polygon and is substantially parallel to that side. In other words, the metal sub-segment 320c corresponds to a part of the metal sub-segments of the metal segment 310, with the part of the metal sub-segments being adjacent to the projection of the metal sub-segment 320c on the lower metal layer and substantially parallel to the metal sub-segment 320c. Practically, the metal sub-segment 320a and the metal sub-segment 320b form a polyline metal segment whose shape is substantially the same as a partial contour of the polygon. The metal sub-segment 320d extends from one terminal of the metal sub-segment 320c to the outside of the outermost turn of the spiral coil; more specifically, the metal sub-segment 320d extends from a place between the innermost turn of the spiral coil and the outermost turn of the spiral coil to a range not surrounded by the outermost turn of the spiral coil. The metal sub-segment 320d crosses at least one turn of the spiral coil (three turns for this embodiment); that is, the metal sub-segment 320d partially overlaps with the metal segment 310.

Figure 3B:
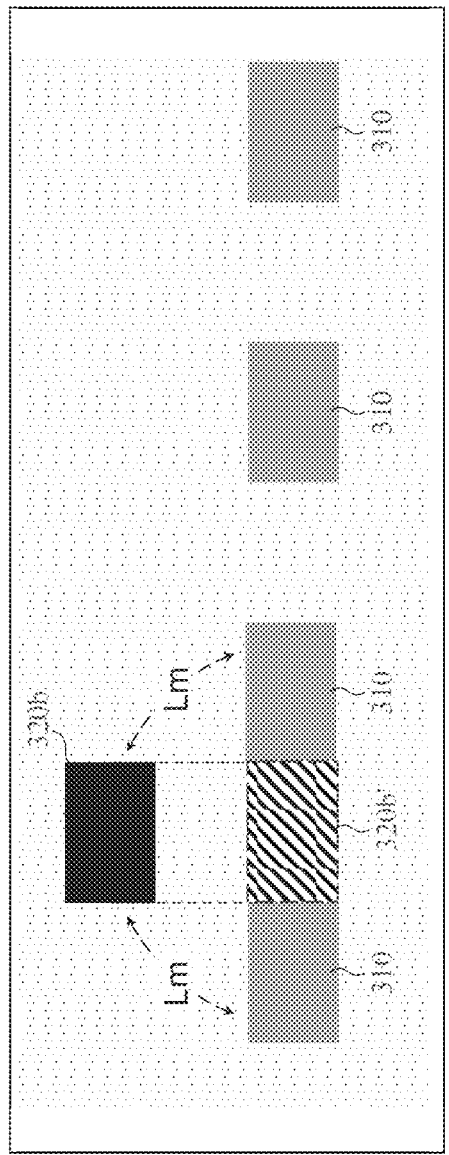
FIG. 3B illustrates a cross-sectional view corresponding to the cross section A-A of FIG. 3A according to an embodiment of this invention.
Figure 3C:
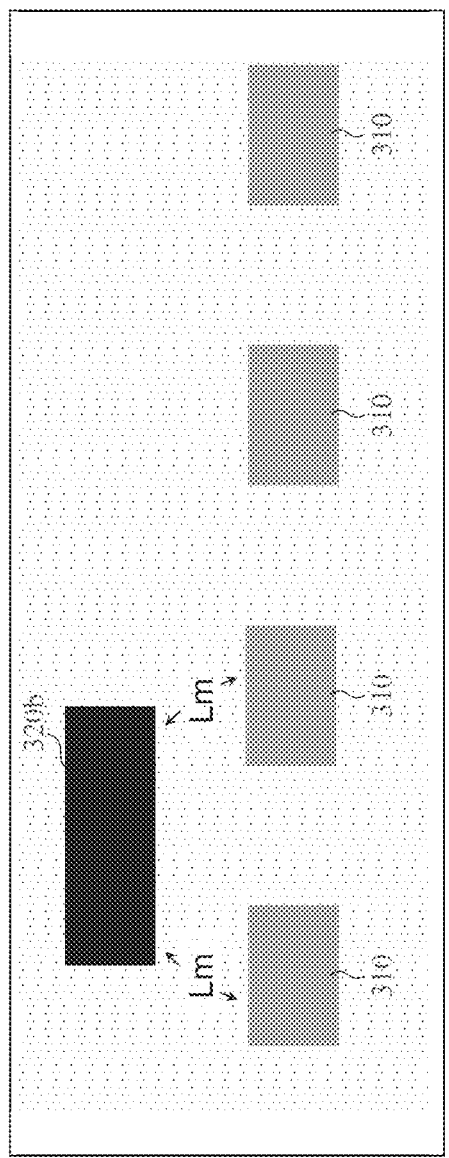
FIG. 3C illustrates a cross-sectional view corresponding to the cross section A-A of FIG. 3A according to another embodiment of this invention.

FIG. 3B is a cross-sectional view corresponding to the cross section A-A of FIG. 3A according to an embodiment of this invention. In one embodiment, the metal sub-segment 320b does not overlap with the metal segment 310; that is, the projection of the metal sub-segment 320b on the lower metal layer (i.e., the metal layer in which the metal segment 310 is disposed) is between two turns of the spiral coil. In other words, the width of the metal sub-segment 320b is smaller than or equal to the gap between the metal segment 310 adjacent to the projection 320b'. FIG. 3C is a cross-sectional view corresponding to the cross section A-A of FIG. 3A according to another embodiment of this invention. In this embodiment, the metal sub-segment 320b and the metal segment 310 at least partially overlap; that is, the width of the metal sub-segment 320b is greater than the gap between the adjacent metal segment 310. As shown in FIG. 3B and FIG. 3C, mutual inductance Lm is generated between the metal sub-segment 320b and its neighboring metal segments 310. Since the overall inductance of the asymmetric spiral inductor 300 includes the self-inductance portion (mainly from the mutual induction among the metal sub-segments of the metal segment 310) and the mutual-inductance portion (mainly from the mutual induction between the metal segment 310 and the metal segment 320), increasing the mutual inductance helps to improve the overall inductance of the asymmetric spiral inductor 300. The magnitude of the mutual inductance Lm can be adjusted by changing the width of the metal sub-segment 320b. Note that although FIGS. 3B and 3C show the cross-sectional view of the metal sub-segment 320b, the foregoing discussion regarding FIG. 3B and FIG. 3C also applies to the metal sub-segment 320c.

FIG. 4A is a structure of the asymmetric spiral inductor according to another embodiment of the present invention. The asymmetric spiral inductor 400 is fabricated in a semiconductor structure and mainly includes a metal segment 410 and a metal segment 420, which includes the metal sub-segments 420a to 420d. In this embodiment, the metal segment 410 is fabricated in the lower metal layer, and the metal segment 420 is fabricated in the upper metal layer. The metal segment 410 and the metal segment 420 are connected by the connection structure 405. The metal segment 410 has two terminals, one of which is the terminal 412, and the other of which is connected to the metal segment 420 through the connection structure 405. Similarly, the metal segment 420 has two terminals, one of which is the terminal 422, and the other of which is connected to the metal segment 410 through the connection structure 405. Being connected, the metal segment 410 and the metal segment 420 together form an asymmetric spiral inductor 400. The two terminals of the asymmetric spiral inductor 400 are the terminal 412 and the terminal 422.

Figure 4B:
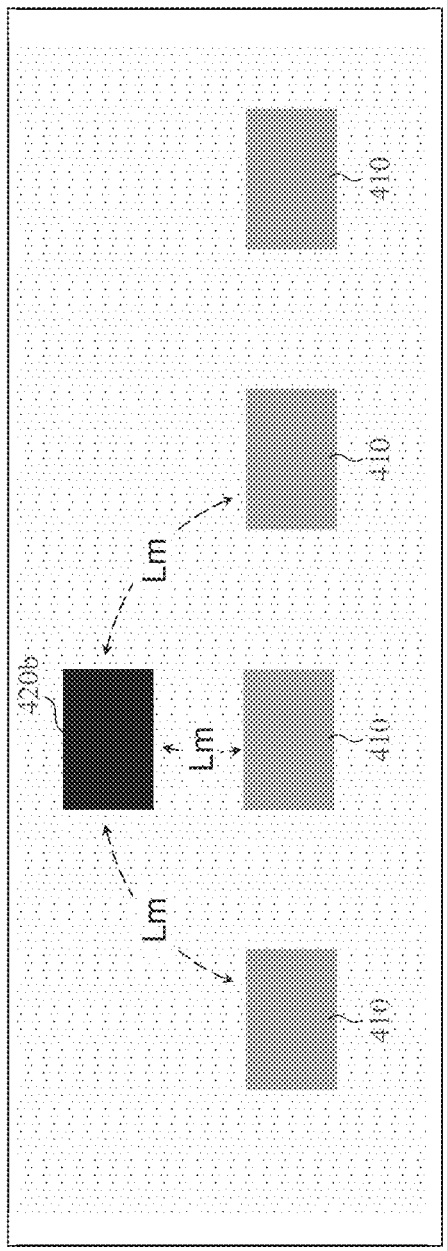
FIG. 4B illustrates a cross-sectional view corresponding to the cross section A-A of FIG. 4A.

The metal segment 420 is similar to the metal segment 320, except that part of the metal sub-segments (i.e., 420b and 420c) of the metal segment 420 substantially overlaps with the metal segment 410. FIG. 4B is a cross-sectional view corresponding to the cross section A-A of FIG. 4A. In this embodiment, the metal sub-segment 420b substantially overlaps with part of one of the turns of the metal segment 410. The width of the metal segment 420 may be substantially equal to the width of the metal segment 410 right beneath the metal segment 420, or may be greater or smaller than the width of the metal segment 410 right beneath the metal segment 420. As shown, there is mutual inductance Lm between the metal sub-segment 420b and its adjacent metal segment 410, which is beneficial to increasing the overall inductance of the asymmetric spiral inductor 400.

Note that although FIG. 4B shows the cross-sectional view of the metal sub-segment 420b, the foregoing discussion regarding FIG. 4B also applies to the metal sub-segment 420c.

Figure 5:
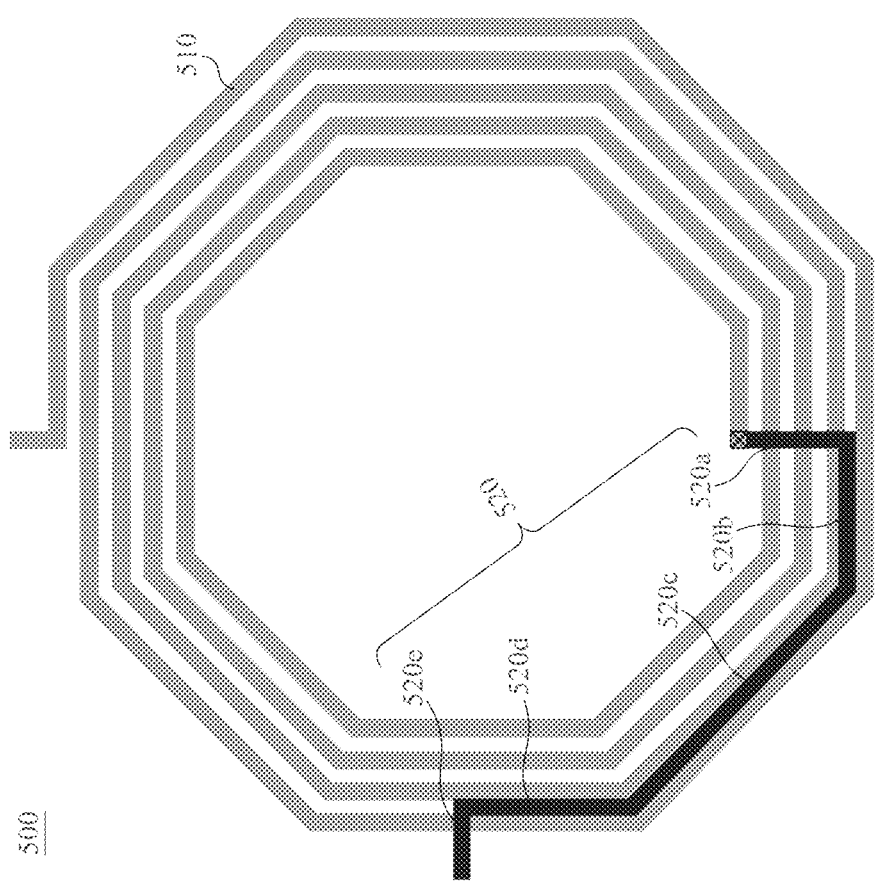
FIG. 5 illustrates a structure of the asymmetric spiral inductor according to another embodiment of the present invention.

FIG. 5 is a structure of the asymmetric spiral inductor according to another embodiment of the present invention. The asymmetric spiral inductor 500 is fabricated in a semiconductor structure and mainly includes the metal segment 510 and the metal segment 520, which includes the metal sub-segments 520a to 520e. In this embodiment, the metal sub-segment 520a crosses at least one of the turns of the spiral coil (three turns for this embodiment); that is, the metal sub-segment 520a partially overlaps with the metal segment 510. The spiral coil is a polygon with N sides (N>4), and the metal sub-segments 520b, 520c and 520d each extend along one of the sides of the polygon and are substantially parallel to the side. In other words, the metal sub-segments 520b, 520c, and 520d each correspond to a portion of the metal sub-segments of the metal segment 510, with the portion of the metal sub-segments of the metal segment 510 being adjacent to the projections of the metal sub-segments 520b, 520c or 520d on the lower metal layer and substantially parallel to the metal sub-segments 520b, 520c or 520d. The metal sub-segment 520b, the metal sub-segment 520c and the metal sub-segment 520d form a polyline metal segment whose shape is substantially the same as a partial contour of the polygon. The metal sub-segment 520e extends from one terminal of the metal sub-segment 520d to the outside of the outermost turn of the spiral coil. More specifically, the metal sub-segment 520e extends from a place between the innermost turn of the spiral coil and the outermost turn of the spiral coil to a range that is not surrounded by the outermost turn of the spiral coil. The metal sub-segment 520e crosses at least one turn of the spiral coil (one turn for this embodiment); that is, the metal sub-segment 520e partially overlaps with the metal segment 510.

Figure 6:
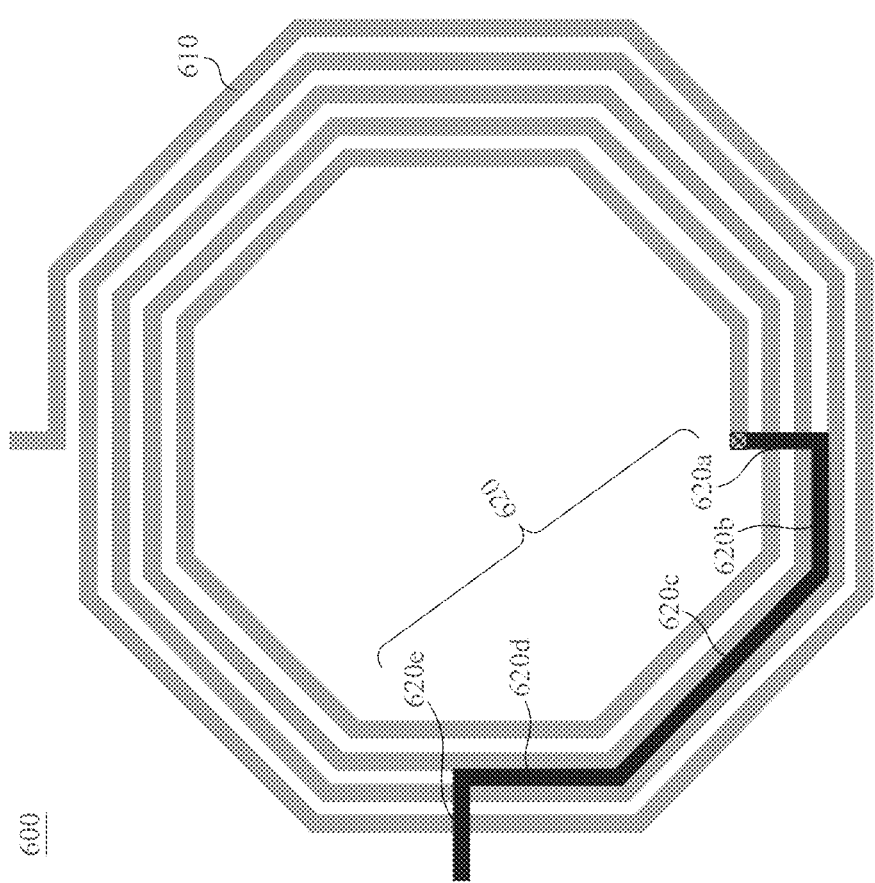
FIG. 6 illustrates a structure of the asymmetric spiral inductor according to another embodiment of the present invention.

FIG. 6 is a structure of the asymmetric spiral inductor according to another embodiment of the present invention. The asymmetric spiral inductor 600 is fabricated in a semiconductor structure and mainly includes a metal segment 610 and a metal segment 620, which includes the metal sub-segments 620a to 620e. Similar to FIG. 5, the metal sub-segment 620a crosses at least one turn of the spiral coil (two turns for this embodiment), and the metal sub-segment 620e crosses at least one turn of the spiral coil (tow turns for this embodiment). The metal sub-segment 620b, the metal sub-segment 620c, and the metal sub-segment 620d form a polyline metal segment whose shape is substantially the same as a partial contour of the polygon.

Figure 7:
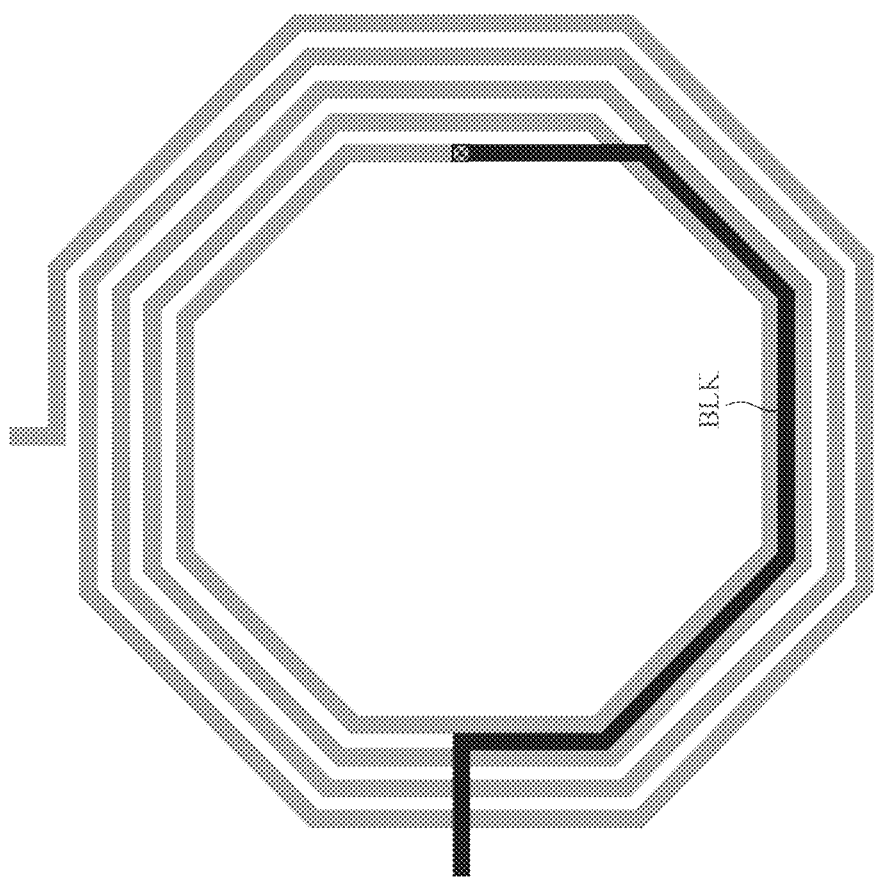
FIG. 7 illustrates a structure of the asymmetric spiral inductor according to another embodiment of the present invention.
Figure 8:
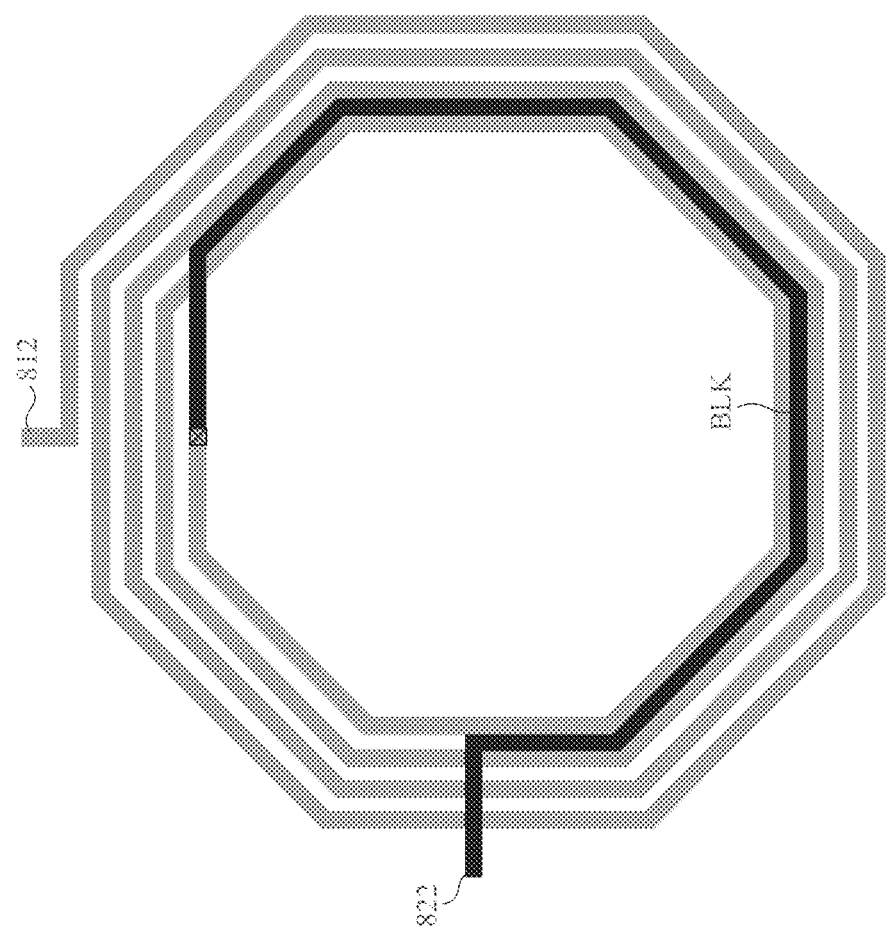
FIG. 8 illustrates a structure of the asymmetric spiral inductor according to another embodiment of the present invention.
Figure 9:
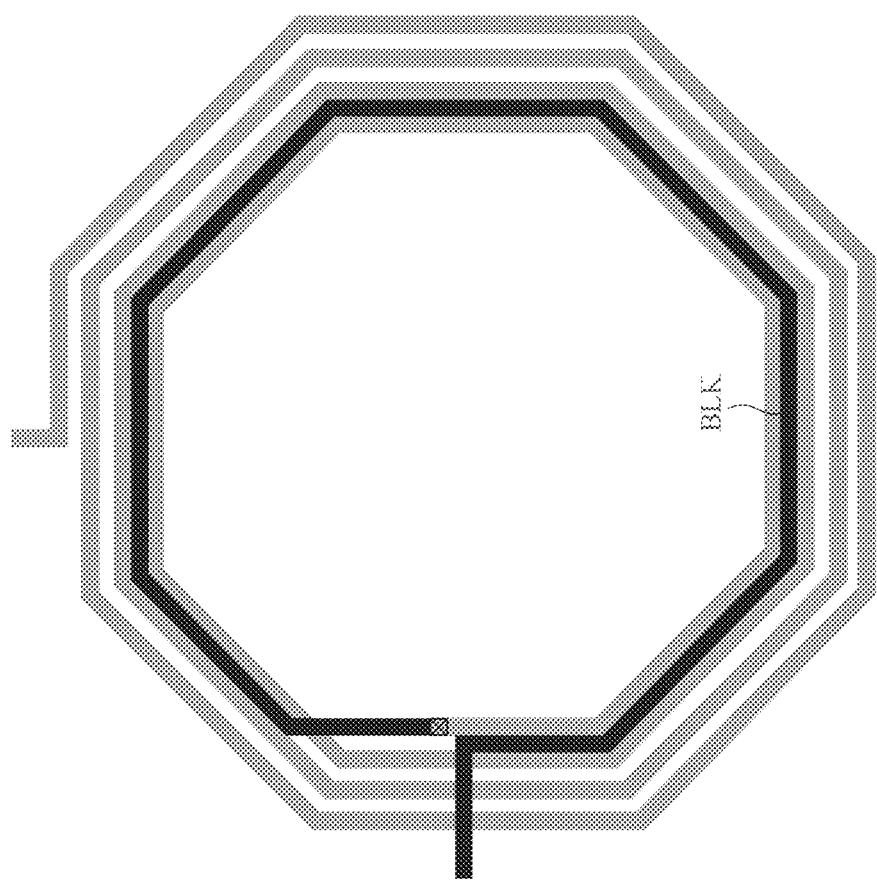
FIG. 9 illustrates a structure of the asymmetric spiral inductor according to another embodiment of the present invention.

Although the length of the metal segment fabricated in the upper metal layer and not forming a complete spiral coil (i.e., the metal segment in black) is approximately equal to a quarter turn of the lower spiral coil, the metal segment may have different lengths. As shown in FIGS. 7 to 9, the length of the metal segment BLK is about one-half turn, three-quarter turn and one turn of the spiral coil, respectively. Likewise, the shape of the metal segment BLK is substantially similar to a partial contour of the spiral coil. Since the resistance of the RDL is typically higher than that of the UTM layer, if the length of the metal segment BLK becomes greater than one turn of the spiral coil, the resistance of the metal segment BLK would become too high, resulting in the decrease in the quality factor Q of the asymmetric spiral inductance. Preferably, in the present invention, the length of the metal segment disposed in the metal layer having higher resistance is substantially not greater than one turn of the spiral coil.

Figure 10:
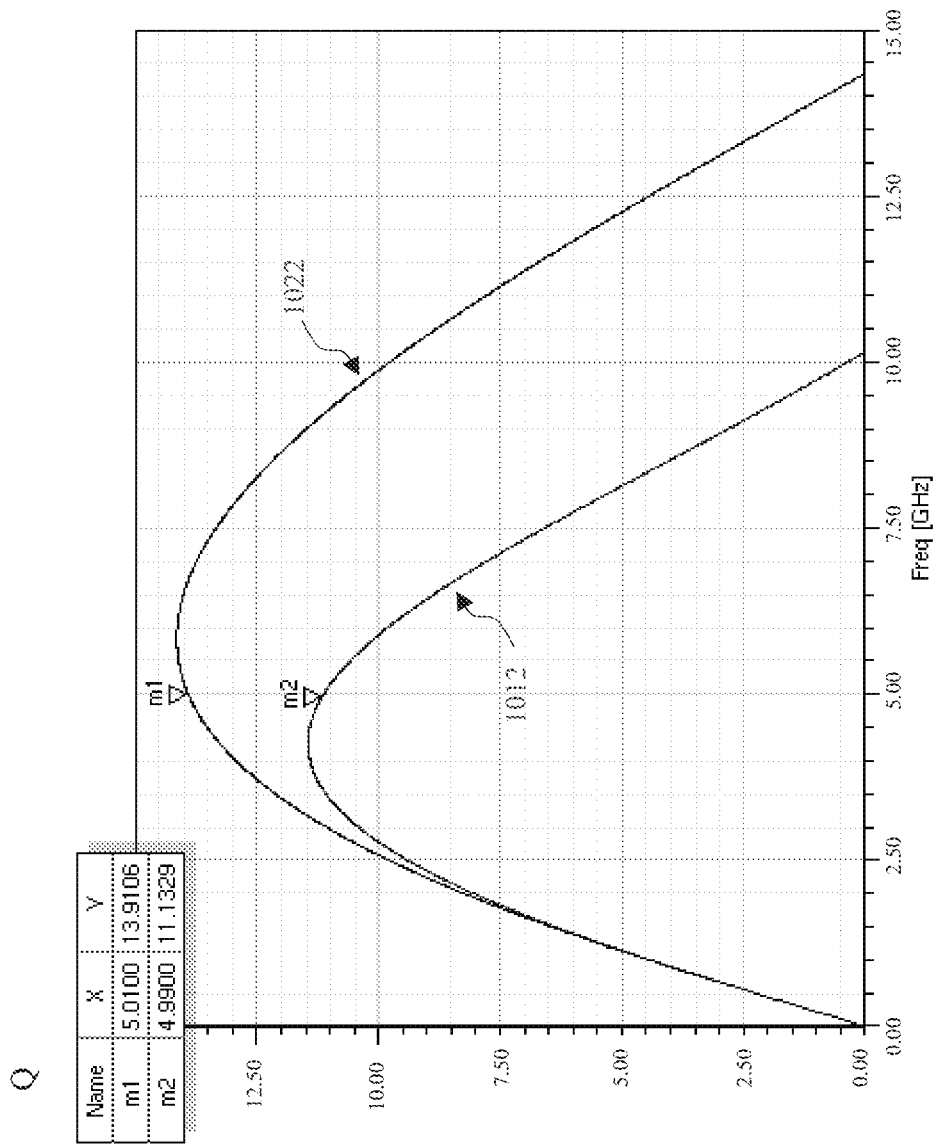
FIG. 10 illustrates the relationship between the quality factor Q and the frequency of the asymmetric spiral inductor of FIG. 8.

FIG. 10 shows the relationship between the quality factor Q and the frequency of the asymmetric spiral inductor of FIG. 8. The curve 1012 represents the quality factor Q when the signal is inputted from the terminal 812, and the curve 1022 represents the quality factor Q when the signal is inputted from the terminal 822. When the terminal 812 is used as the input terminal, the terminal 822 is directly or indirectly coupled to a reference voltage (e.g., ground), and the directions of the currents in the spiral coil and the metal segment BLK are both clockwise. When the terminal 822 is used as the input terminal, the terminal 812 is directly or indirectly coupled to a reference voltage (e.g., ground), and the directions of the currents in the spiral coil and the metal segment BLK are both counterclockwise. Because the difference between the curves 1012 and 1022 at high frequencies (e.g., frequencies greater than or equal to 5 GHz) is quite large (i.e., the difference in the quality factor Q is great), the asymmetric spiral inductor of the present invention has the advantage of suppressing signal reflections. For example, at the frequencies around 5 GHz, the quality factor Q corresponding to the case where the signal is inputted from the terminal 812 is about 11.1329, and the quality factor Q corresponding to the case where the signal inputted from the terminal 822 is about 13.9106; there is a difference of about 2.7777. When the frequency is greater than 5 GHz, the difference in the quality factor Q between the two cases becomes greater. More specifically, reflected signals are generated when the input signal inputted from the terminal 822 reaches the terminal 812; in this instance, the reflected signals encounter the poorer quality factor Q (corresponding to the curve 1012; that is, the reflected signals can be regarded as the signals inputted from the terminal 812). Therefore, the asymmetric spiral inductor of the present invention is more resistant to disturbances caused by the reflected signals.

Figure 11:
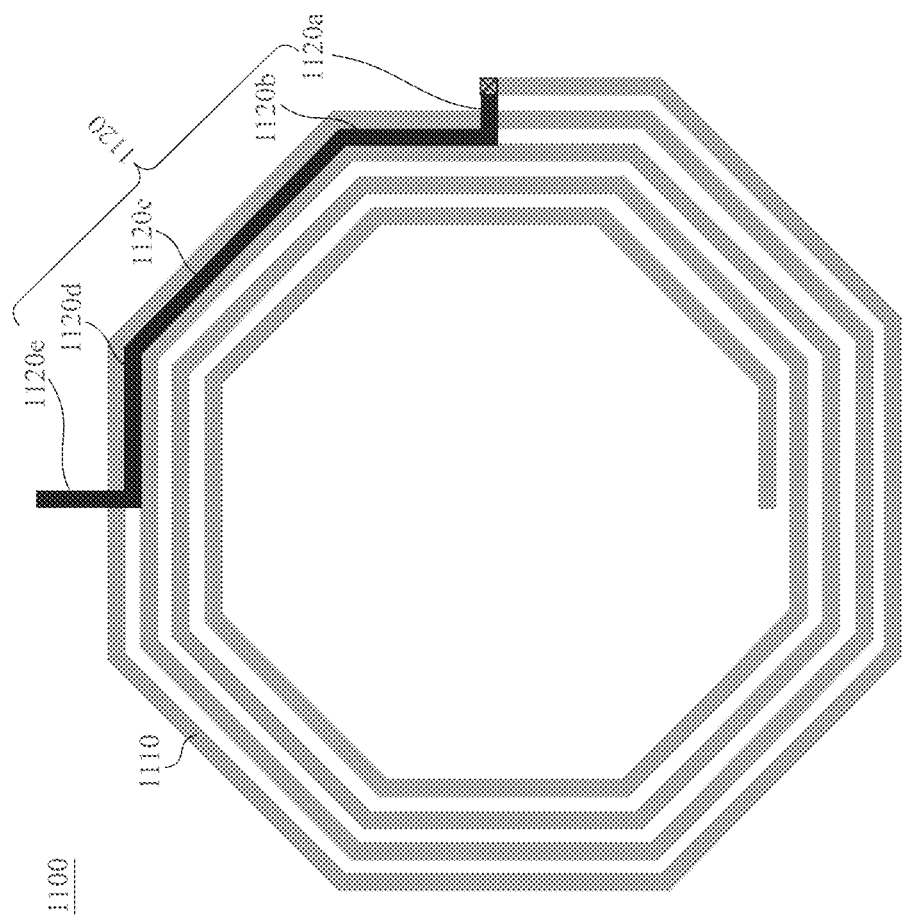
FIG. 11 illustrates a structure of the asymmetric spiral inductor according to another embodiment of the present invention.

FIG. 11 is a structure of the asymmetric spiral inductor according to another embodiment of the present invention. The asymmetric spiral inductor 1100 is fabricated in a semiconductor structure and mainly includes the metal segment 1110 and the metal segment 1120, which includes the metal sub-segments 1120a to 1120e. The metal sub-segment 1120a extends from the outside of the outermost turn of the spiral coil to a place between the innermost turn of the spiral coil and the outermost turn of the spiral coil. More specifically, the metal sub-segment 1120a crosses at least one turn of the spiral coil (one turn for this embodiment). The metal sub-segments 1120b, 1120c and 1120d each extend along one of the sides of the polygon and are substantially parallel to the side. The metal sub-segment 1120b, the metal sub-segment 1120c, and the metal sub-segment 1120d form a polyline metal segment whose shape is substantially the same as a partial contour of the polygon. The metal sub-segment 1120e extends from one terminal of the metal sub-segment 1120d to the outside of the outermost turn of the spiral coil. More specifically, the metal sub-segment 1120e extends from a place between the innermost turn of the spiral coil and the outermost turn of the spiral coil to a range not surrounded by the outermost turn of the spiral coil, and the metal sub-segment 1120e crosses at least one turn of the spiral coil (one turn for this embodiment). In the embodiment shown in FIG. 11, the number of turns that the metal sub-segment 1120a crosses is the same as the number of turns that the metal sub-segment 1120e crosses.

Figure 12:
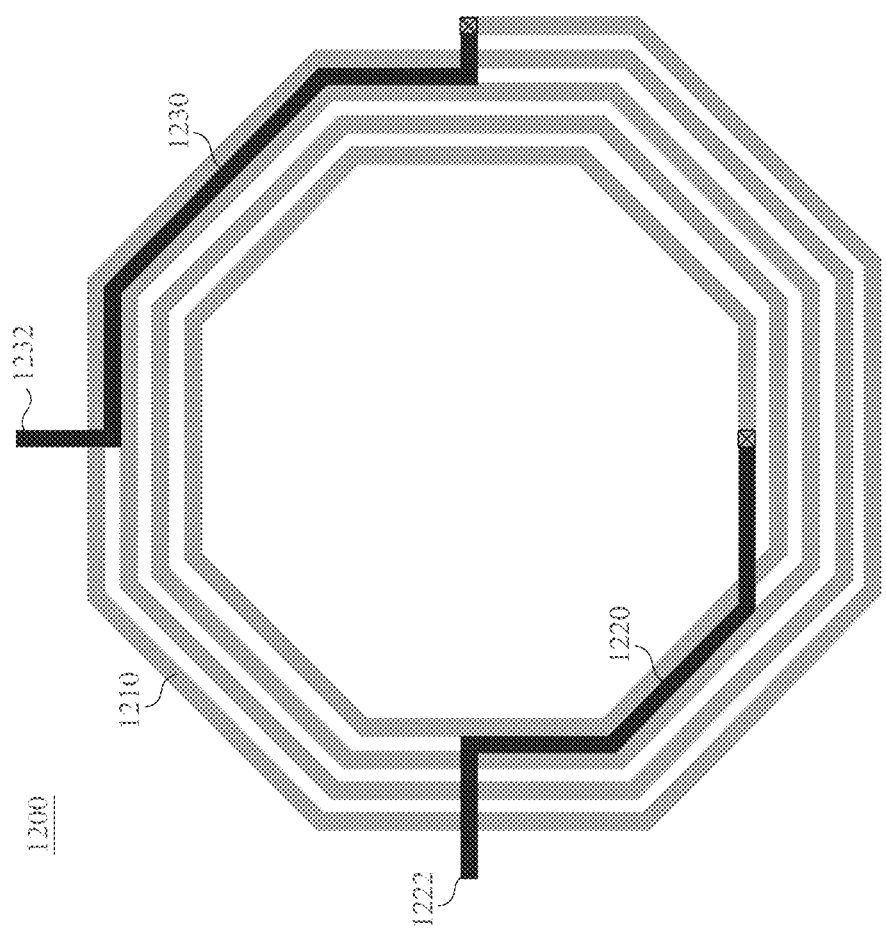
FIG. 12 illustrates a structure of the asymmetric spiral inductor according to another embodiment of the present invention.

FIG. 12 is a structure of the asymmetric spiral inductor according to another embodiment of the present invention. The asymmetric spiral inductor 1200 is fabricated in a semiconductor structure and mainly includes the metal segment 1210, the metal segment 1220, and the metal segment 1230. The two terminals 1222 and 1232 of the asymmetric spiral inductor 1200 are connected to the lower spiral coil through the metal segments 1220 and 1230 in the upper layer, respectively. By adjusting the lengths and/or widths of the metal segments 1220 and 1230, the quality factor Q corresponding to the terminal 1222 (i.e., signals inputted from the terminal 1222) may be closer to or more different from the quality factor Q corresponding to the terminal 1232 (i.e., signals inputted from the terminal 1232).

In summary, the present invention can increase the inductance of the asymmetric spiral inductor without increasing the inductor area, thereby improving the quality factor Q. In addition, the asymmetric spiral inductor of the present invention has extremely asymmetric quality factors Q, which helps to reduce signal reflections. Please note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An asymmetric spiral inductor fabricated in a semiconductor structure, comprising:
  a spiral coil substantially disposed in a first metal layer and having a first terminal and a second terminal, wherein the first terminal is disposed at an outermost turn of the spiral coil, and the second terminal is disposed at an innermost turn of the spiral coil;
  a metal segment disposed in a second metal layer different from the first metal layer and having a third terminal and a fourth terminal; and
  a connection structure connecting the second terminal and the third terminal;
  wherein the first terminal and the fourth terminal form two terminals of the asymmetric spiral inductor, the spiral coil is a polygon with N sides, N is greater than 4, and a portion of the metal segment has a shape substantially the same as a portion of the contour of the polygon;
  wherein the metal segment comprises:
    a first metal sub-segment, wherein the first metal sub-segment is connected to the spiral coil through the connection structure and extends from the innermost turn of the spiral coil to a place between the innermost turn of the spiral coil and the outermost turn of the spiral coil;
    a second metal sub-segment, wherein the second metal sub-segment is connected to the first metal sub-segment and substantially parallel to a corresponding portion of the spiral coil, and substantially disposed between the innermost turn of the spiral coil and the outermost turn of the spiral coil without crossing the innermost turn of the spiral coil; and
    a third metal sub-segment, wherein the third metal sub-segment is connected to the second metal sub-segment and is a straight segment extending from a place between the innermost turn of the spiral coil and the outermost turn of the spiral coil to an outside of the outermost turn of the spiral coil without bending.

2. The asymmetric spiral inductor of claim 1, wherein the first metal sub-segment partially overlaps with the spiral coil, a projection of the second metal sub-segment on the first metal layer is substantially between two turns of the spiral coil, and the third metal sub-segment partially overlaps with the spiral coil.

3. The asymmetric spiral inductor of claim 1, wherein the first metal sub-segment partially overlaps with the spiral coil, the second metal sub-segment at least partially overlaps with the spiral coil, and the third metal sub-segment partially overlaps with the spiral coil.

4. The asymmetric spiral inductor of claim 1, wherein the length of the metal segment is not greater than one turn of the spiral coil.

5. The asymmetric spiral inductor of claim 1, wherein the metal segment is a first metal segment, and the connection structure is a first connection structure, the asymmetric spiral inductor further comprising:
   a second metal segment disposed in the second metal layer and having a fifth terminal and a sixth terminal; and
   a second connection structure connecting the first terminal and the fifth terminal;
   wherein the fourth terminal and the sixth terminal form two terminals of the asymmetric spiral inductor, and a portion of the second metal segment has a shape substantially the same as a portion of the contour of the polygon with N sides.

* * * * *